(12) United States Patent
Gillespie et al.

(10) Patent No.: US 8,656,339 B2
(45) Date of Patent: Feb. 18, 2014

(54) METHOD FOR ANALYZING SENSITIVITY AND FAILURE PROBABILITY OF A CIRCUIT

(75) Inventors: Kevin M. Gillespie, Pembroke, MA (US); Timothy J. Correia, Burlington, MA (US); Donald A. Priore, Groton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 12/975,585

(22) Filed: Dec. 22, 2010

(65) Prior Publication Data
US 2012/0167025 A1 Jun. 28, 2012

(51) Int. Cl.
*G06F 17/50* (2006.01)
*G06F 9/455* (2006.01)
*G06F 11/22* (2006.01)
*G06G 7/62* (2006.01)

(52) U.S. Cl.
USPC ........... 716/136; 716/106; 716/111; 716/113; 703/13; 703/14

(58) Field of Classification Search
None
See application file for complete search history.

(56) References Cited

U.S. PATENT DOCUMENTS

| | | | |
|---|---|---|---|
| 5,751,593 A * | 5/1998 | Pullela et al. | 716/113 |
| 7,003,742 B2 * | 2/2006 | Saxena et al. | 716/102 |
| 7,487,474 B2 * | 2/2009 | Ciplickas et al. | 716/135 |
| 7,933,760 B2 * | 4/2011 | Schreiber et al. | 703/14 |
| 2009/0248383 A1 | 10/2009 | Schreiber et al. | |

* cited by examiner

*Primary Examiner* — A. M. Thompson
(74) *Attorney, Agent, or Firm* — Volpe and Koenig, P.C.

(57) ABSTRACT

A method, implemented in a processor, of determining a likelihood of failure of a circuit to be made in accordance with a circuit design, and a computer-readable storage medium storing instructions to the processor for carrying out the method. A sensitivity of a figure of merit to each variable of a plurality of variables is determined by simulating operation of the circuit using the processor. Determining the sensitivity is based on a departure of each of the variables from a respective mean value, where the variables include at least one variable derived from measurements of a fabricated component or component combination to be included in the circuit. Results from the simulation are used to predict a failure probability of the circuit to be made in accordance with the circuit design.

16 Claims, 4 Drawing Sheets

METHOD FOR ANALYZING SENSITIVITY AND FAILURE PROBABILITY OF A CIRCUIT

FIELD OF INVENTION

This disclosure relates to simulation of electronic circuits.

BACKGROUND

In the design of an integrated circuit device, it is typically useful to simulate functional modules of the device, prior to building physical device samples, in order to ensure that the device will operate in compliance with a specification. Modules, in turn, are assemblies of circuits, and each circuit is made up of physical components such as transistors.

Models of circuits are used to simulate operation of the physical circuits. In the simulation process, it is desirable to determine the extent of potential variability in the operation of a circuit, so that variability in circuit operation can be accounted for in the design of an entire integrated circuit device.

One method of determining the variability of a circuit includes simulating the operation of the circuit while randomly varying each of a number of component characteristics such as transistor threshold voltage, transistor channel length, and transistor channel width, for each transistor of the circuit. Such methods are known as Monte Carlo methods. However, this process can be unduly lengthy. For example, for a circuit having 6 transistors, with three component characteristics for each transistor, millions of simulations may be run in order to determine circuit variability, requiring many hours or days of simulation time. Alternatively, the operation of the circuit can be simulated assuming that each component characteristic of the circuit is at a specified worst-case variation from nominal values. However, these assumptions typically will not accurately reflect actual operating conditions of the circuit.

SUMMARY OF EMBODIMENTS

Methods are disclosed of determining a likelihood of failure of a circuit made in accordance with a circuit design due to certain variations. The circuit design preferably represents a module for inclusion in an integrated circuit device.

Measurements are performed on previously fabricated components (or combinations of components) that are included in the circuit design. A plurality of variables are defined based on the measurements, each variable preferably having a mean and a standard deviation. A figure of merit that is dependent on the variables is defined for the circuit design. A failure criterion based on the figure of merit is also defined for the circuit design. A sensitivity of the figure of merit to each variable is determined by simulating operation of a circuit made in accordance with the circuit design based on a departure of each variable from its mean value. A plurality of normalized sensitivities of the figure of merit is determined using the sensitivity of the figure of merit to each variable. A simulation deviation for each variable is determined based on the normalized sensitivities and a predetermined maximum tolerable failure probability for a circuit made in accordance with the circuit design. A value of the figure of merit is determined using the plurality of simulation deviations. Using the determined value of the figure of merit and the failure criterion, a prediction is made whether a circuit made in accordance with the circuit design will fail.

DETAILED DESCRIPTION OF EMBODIMENTS

A method of simulating operation of a circuit made in accordance with a circuit design and determining a likelihood, or probability, of failure of the circuit includes selecting a predetermined maximum tolerable failure probability for the circuit design. The method includes determining sensitivities of a circuit model to variations in value of different component characteristics of one or more components or component combinations included in the circuit design. Component characteristics include, for example, threshold voltages, channel lengths, and channel widths of transistors. These component characteristics may be referred to, collectively, as variables.

The determined sensitivities to the variables are normalized, so that each normalized value represents the relative sensitivity of the circuit made in accordance with a circuit design, under the simulated device parameters, to the component characteristic associated with the value. The normalized sensitivity values can be scaled based on a tolerance factor, and the adjusted sensitivities used to model the behavior of each respective circuit component or component combination of the circuit in subsequent simulations.

Figure 1:
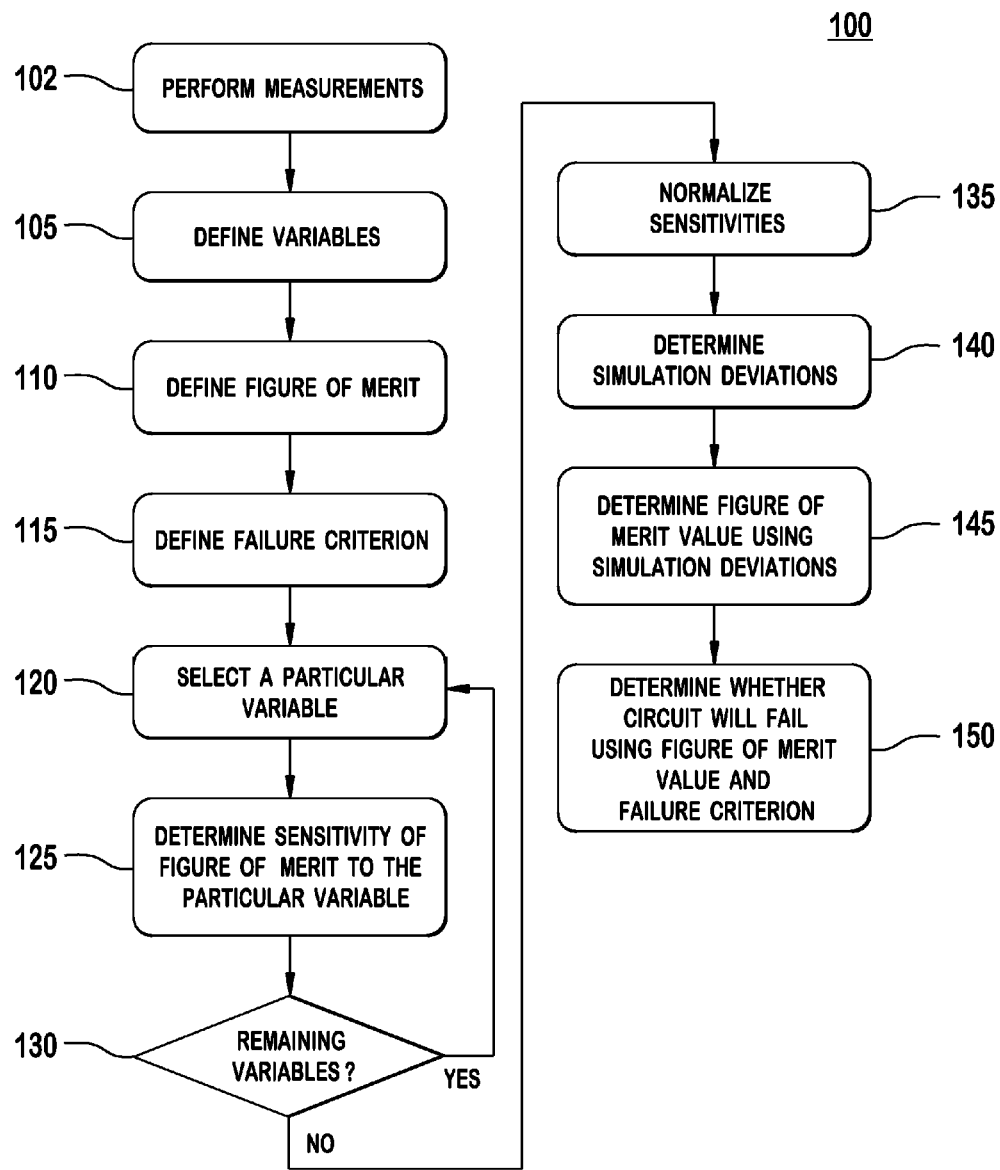
FIG. 1 is a flow diagram of a method for determining a likelihood of failure of a circuit made in accordance with a circuit design.

FIG. 1 shows an embodiment 100 of a method for determining a likelihood of failure of a circuit made in accordance with a circuit design due to variations in the values of variables, as described above. Variations in component characteristics may, for example, arise unavoidably from statistical variations in manufacturing processes such as semiconductor fabrication. Measurements of variables are performed 102 on a plurality of fabricated components or component combinations included in the circuit design. In one example, measurements are performed with respect to a plurality of circuit components or component combinations that collectively comprise the circuit design. Such variables may include, for example, transistor threshold voltages, channel widths, and channel lengths for each respective circuit component or component combination for which measurements are performed. Based on these measurements a mean and a standard deviation are determined for each variable.

For mathematical convenience, the variables may be transformed into normalized dimensionless form—that is a form in which the variables are expressed as pure numbers, without units, having a mean of zero and a standard deviation of 1. For example, each variable $v_i$ being considered may be transformed into a corresponding dimensionless variable $w_i$ according to Equation (1):

$$w_i = (v_i - m_i)/\sigma_i \qquad \text{Equation (1)}$$

In Equation (1), $m_i$ and $\sigma_i$ are the mean and standard deviation of variable $v_i$, respectively.

Referring to FIG. 1, a set of variables is defined 105 that are used to determine the likelihood of failure of a circuit made in accordance with the circuit design. A mean and a standard deviation are determined for each variable in the set.

The set may include variables measured directly with respect to fabricated circuit components or component combinations, as described above. The set may also include newly defined variables based on the directly measured variables. As an example, the directly measured variables may each be expressed in dimensionless form, as described above, and a new dimensionless variable may then be defined as a linear combination of the variables resulting from direct measurement. Using basic statistics, a mean and a standard deviation may then be determined for the new variable from the means and standard deviations of variables resulting from direct measurement. For convenience, the term "variable" preferably designates a dimensionless variable unless otherwise noted in the further description of the example methods below.

A figure of merit that is dependent on the set of variables is defined for the circuit design 110. A failure criterion for the circuit design is defined based on the figure of merit 115. For example the circuit design may include state elements that data can be written into, or read from. An example of a circuit with this type of circuit design is a random access memory (RAM) that includes cells as state elements. The question is whether or not data, such as a binary bit, may be written into a cell under steady state or direct current (DC) conditions and maintained in the cell under such conditions, i.e., the DC writability of the cell. The figure of merit for such an example may be a wordline voltage. The failure criterion may be that the cell is considered not writable if, under a particular testing condition simulating an attempt to write a bit into the cell, the simulated required wordline voltage exceeds 95% of a supply reference voltage $V_{DD}$.

Another example is writability and maintainability of data in a RAM cell under time-varying, or alternating current (AC), conditions. In this example, a figure of merit may be an increase in a delay time. In a simulation, a predefined delay time of a signal passing through a portion of a circuit is determined. A failure criterion may be that an increase in the delay time from a nominal delay time must not exceed a predefined value.

Referring again to FIG. 1, determining a sensitivity of the figure of merit begins with selecting a particular variable from the set of variables 120. A sensitivity of the figure of merit to variations of the particular variable is determined and stored 125. In one example, the sensitivity is determined using a method shown in FIGS. 2 and 3 and described below.

Once a sensitivity of the figure of merit is determined 125, a check is made of whether there are other remaining variables in the set 130. If there are, then a new variable is selected 120 and a new sensitivity of the figure of merit to this new variable is determined. The method continues until sensitivities of the figure of merit with respect to all of the variables have been determined 130.

Once all of the sensitivities have been determined, they are normalized 135. In one example, each sensitivity is normalized by dividing it by the square root of the sum of the squares of all the sensitivities. This yields a set of dimensionless sensitivities of the figure of merit, one such sensitivity to each variable, such that the sum of the squares of all the dimensionless sensitivities is 1.

Using the normalized sensitivities, a simulation deviation for each variable is determined 140. In one example, circuit operation is simulated with each variable set to its mean value plus its simulation deviation. The simulation deviation for a particular variable may be set to the product of the normalized sensitivity of the particular variable, the measured standard deviation for the particular variable, and a tolerance factor. Specifically, the circuit may be simulated, and the figure of merit determined, with the ith variable set to a value $X_i$ given by Equation (2), in which the variables are not necessarily normalized:

$$X_i = m_i + TS_i\sigma_i \qquad \text{Equation (2)}$$

In Equation (2) $m_i$ is the mean of the ith variable, $S_i$ is the dimensionless, normalized sensitivity factor of the ith variable, described above, $\sigma_i$ is the standard deviation of the ith variable, and T is the tolerance factor, which is preferably the same for all the variables. The product $TS_i\sigma_i$ is then preferably used as the simulation deviation.

If dimensionless normalized variables are defined having a mean of 0 and a sigma of 1, as described above, then the simulation deviation value of the ith variable (as well as the value of the variable itself) reduces to $TS_i$. In one example, the tolerance factor T, a dimensionless quantity, may be determined and interpreted based on several assumptions, as follows. First, it is assumed that the figure of merit is a linear function of the variables. Second, it is assumed that the variables are independent of one another and that there is no interaction between them. These assumptions may be relaxed in later simulations to check the validity of the overall method, as explained below. It is further assumed that each variable may be described as varying in value according to a Gaussian ("normal") distribution.

A new dimensionless variable Y may be defined by Equation 3:

$$Y = \sum_i S_i w_i \qquad \text{Equation (3)}$$

where the sum is over all of the variables and the $w_i$ are the normalized dimensionless variables defined in Equation (1). It may be shown mathematically that of all possible linear combinations of the variables, Y is the one to which the figure of merit has the maximum sensitivity. Furthermore, it may be shown that Y has a Gaussian distribution with a standard deviation of 1. It then follows that the variable TY has a standard deviation of T, the tolerance factor introduced above.

The tolerance factor T may now be related to the statistical variation of the variables and the maximum tolerable failure probability for the circuit. This may be done by using the known relationship between probabilities and standard deviation for a Gaussian distribution. For example if T=3, the standard deviation of Y is 3. This means that the probability that Y will be greater than 3 will be 0.00135, or 0.135%. The probability that Y will be greater than 6 is $0.99 \times 10^{-9}$, or about 1 part per billion. The factor T, therefore, may be chosen to match the maximum tolerable failure probability for the circuit due to statistical variation of the variables. For example, if a failure probability of 1 part per billion or less is desired, sometimes referred to as a "6-sigma" requirement, then T is preferably set to 6.

Referring again to FIG. 1, once the value of T is determined based on the maximum tolerable failure probability and the simulation deviations are determined 140, a circuit made in accordance with the circuit design may be simulated with the variables set to values given by Equation (2) to determine the figure of merit 145. The determined figure of merit is then compared with the failure criterion 150. If the failure criterion is not met, the circuit is deemed operable under conditions defined by tolerance factor T. If T is set to 6, for example, and the failure criterion is not met when the circuit is simulated under these conditions, the probability of failure of the circuit due to variations in the variables is believed to be less than about 1 part per billion.

Figure 2:
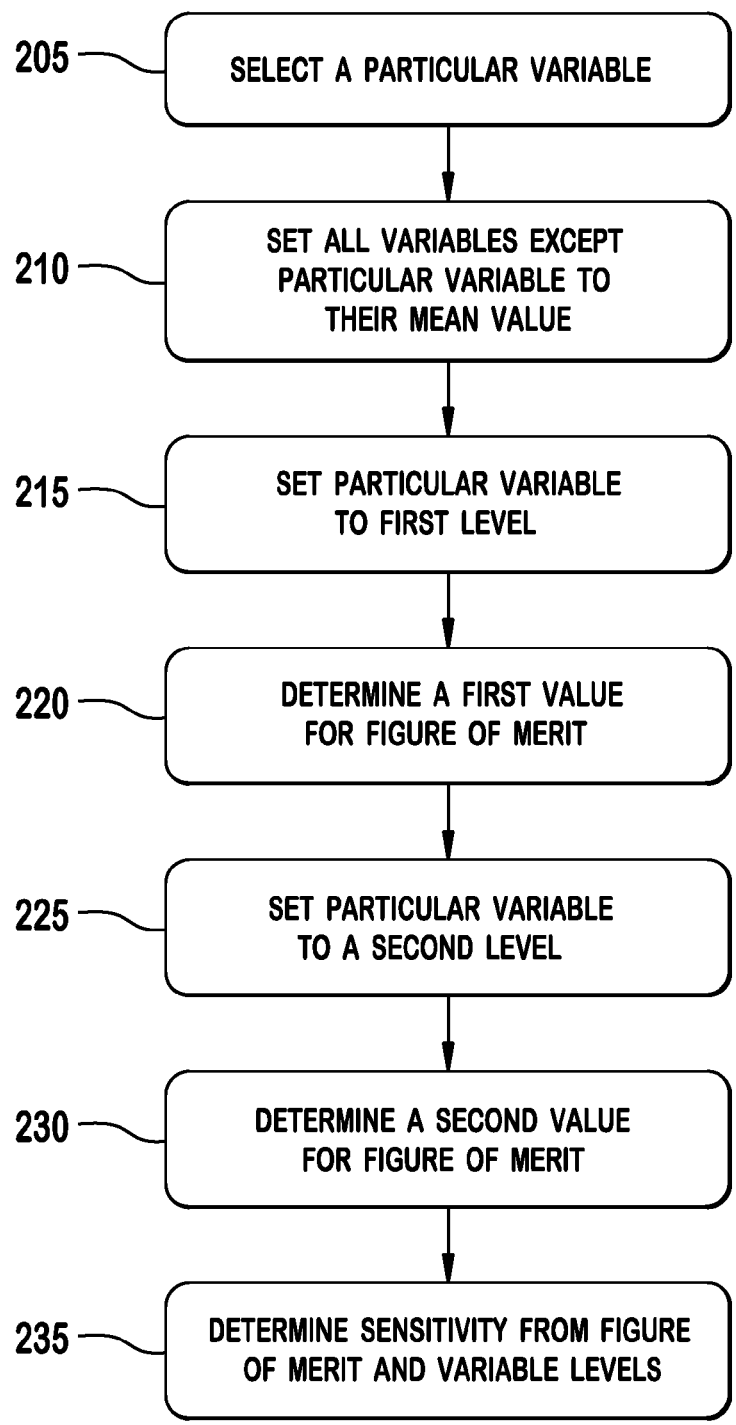
FIG. 2 is a flow diagram of a method for determining a sensitivity of a circuit made in accordance with the circuit design.

FIG. 2 shows an embodiment of a method 200 for determining a sensitivity of the figure of merit. Method 200 is based on an assumption that the figure of merit varies linearly with the particular variable in a neighborhood of the mean of the particular variable. This assumption may be relaxed later, as explained below. After the particular variable is selected 205, all other variables are set to their mean value 210. The value of the particular variable is set to a first level other than its mean 215. With the variables set to these values, circuit operation of a circuit made in accordance with the circuit design is simulated and a first value of the figure of merit is determined and stored 220. The value of the particular variable is then set to a second level 225. Again, circuit operation is simulated and a second value of the figure of merit is determined and stored 230. A sensitivity of the figure of merit to the particular variable is then determined as follows. The first value of the figure of merit is subtracted from the second value of the figure of merit to determine a first difference. The first variable level is subtracted from the second variable to determine a second difference. Finally, the first difference is divided by the second difference to obtain a sensitivity of the figure of merit to the particular variable.

Figure 3:
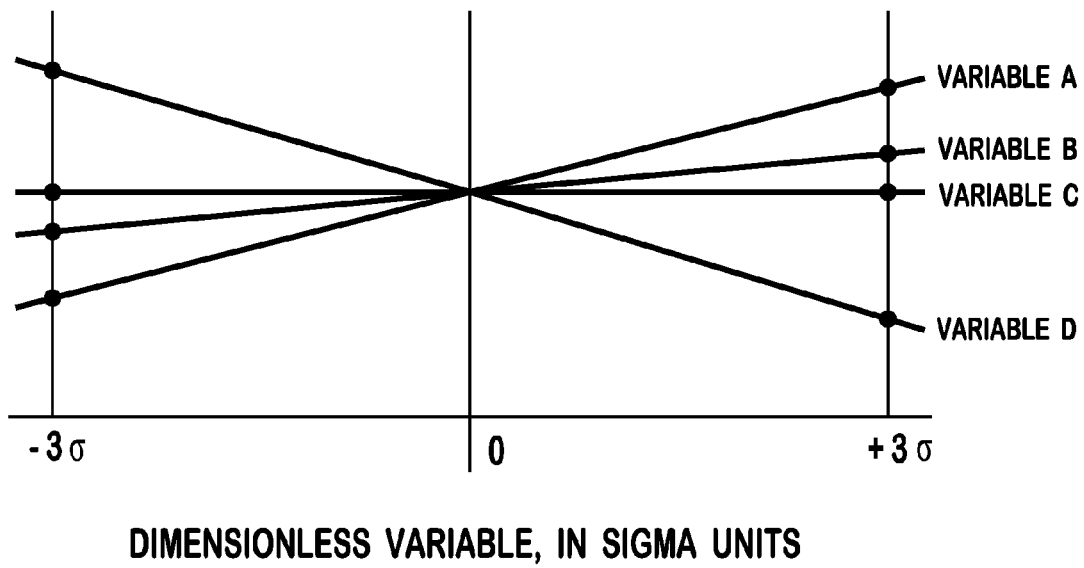
FIG. 3 is a diagram of a method of determining a sensitivity of a circuit made in accordance with the circuit design.

An example of this embodiment of a method for determining a sensitivity to a particular variable is shown in FIG. 3. In FIG. 3, the figure of merit is plotted along the y-axis for four different dimensionless variables, labeled variables A, B, C, and D. In this example, the figure of merit is determined with each variable set to its +3 sigma value and its −3 sigma value and a straight line is drawn between these two points, under the assumption that the figure of merit is a linear function of the variable. As shown in FIG. 3, the sensitivity to each variable, as defined above, is the slope of the line corresponding to the variable. As may be seen, the sensitivity may be positive (variables A and B), zero (variable C) or negative (variable D).

In an embodiment, algorithms used to simulate circuit operation of a circuit made in accordance with the circuit design may include non-linear behavior of the circuit and interactions between variables. Such a simulation, therefore, may serve as a check of the assumptions described above.

Figure 4:
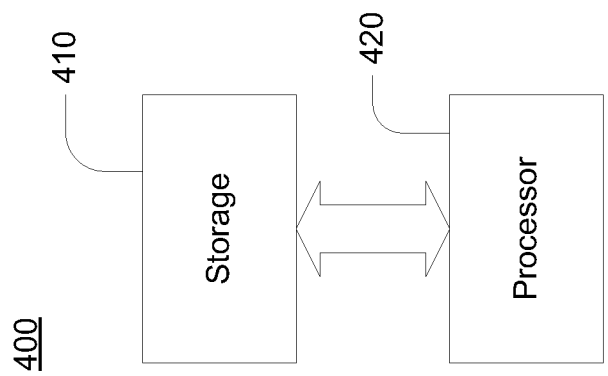
FIG. 4 is a block diagram of an example system in which one or more disclosed embodiments may be implemented.

FIG. 4 is a block diagram of an example device 400 in which one or more disclosed embodiments may be implemented. The device 400 includes a processor 420, and a computer-readable storage medium, or storage, 410. It is understood that the device 400 may include additional components not shown in FIG. 4.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data (e.g., netlists, GDS data, or the like) that may be used to perform a manufacturing process implemented in a semiconductor fabrication facility. The manufacturing process may be adapted to manufacture semiconductor devices (e.g., processors) that embody various aspects of the present invention.

Suitable processors include, by way of example, a general purpose processor, a special purpose processor, a conventional processor, a digital signal processor (DSP), a plurality of microprocessors, a graphics processing unit (GPU), a DSP core, a controller, a microcontroller, application specific integrated circuits (ASICs), field programmable gate arrays (FPGAs), any other type of integrated circuit (IC), and/or a state machine, or combinations thereof.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A method of determining a likelihood of failure of a circuit to be made in accordance with a circuit design, the method comprising:
    performing a set of measurements with respect to at least one fabricated component or component combination to be included in the circuit;
    defining a plurality of variables, including a variable having a mean and a standard deviation based on the measurements corresponding to each measured component or component combination;
    defining a figure of merit for the circuit design, the figure of merit depending on the variables;
    defining a failure criterion for the circuit design based on the figure of merit;
    determining a sensitivity of the figure of merit to each variable by simulating operation of the circuit to be made in accordance with the circuit design based on a departure of each variable from its mean value, the simulating being performed by a processor based on the measurements, wherein the determining comprises:
        setting the values of all variables except a particular variable to their mean values;
        determining a first value for the figure of merit by simulating operation of the circuit to be made in accordance with the circuit design with the particular variable set to a first level;
        determining a second value for the figure of merit by simulating operation of the circuit to be made in accordance with the circuit design with the particular variable set to a second level; and
        determining the sensitivity of the figure of merit to the particular variable based on the first value and second value of the figure of merit;
    determining a plurality of normalized sensitivities of the figure of merit based on the sensitivity of the figure of merit to each variable;
    determining a simulation deviation for each variable based on the normalized sensitivities and based on a predetermined maximum tolerable failure probability for the circuit design;
    determining a value of the figure of merit based on the simulation deviations; and
    predicting whether the circuit to be made in accordance with the circuit design will fail, the predicting based on the determined value of the figure of merit and the failure criterion.

2. The method of claim 1, wherein the determining of the value of the figure of merit comprises simulating operation of the circuit to be made in accordance with the circuit design with each variable set to its mean value plus its simulation deviation.

3. The method of claim 1, wherein determining the sensitivity of the figure of merit to the particular variable comprises:
    subtracting the first value from the second value to determine a first difference;
    subtracting the first level from the second level to determine a second difference; and dividing the first difference by the second difference to obtain the sensitivity of the figure of merit to the particular variable.

4. The method of claim 1, wherein determining a plurality of normalized sensitivities comprises dividing each sensitivity by the square root of the sum of the squares of all of the sensitivities.

5. The method of claim 1, wherein determining a simulation deviation for each variable comprises determining a product of a tolerance factor, the normalized sensitivity of that variable, and the standard deviation of that variable, the tolerance factor based on the predetermined maximum tolerable failure probability.

6. The method of claim 5, wherein the tolerance factor is determined from the predetermined maximum tolerable failure probability based on a Gaussian distribution.

7. The method of claim 1, wherein the circuit design includes writable state elements and a variable is defined with respect to a fabricated component of a writable state element, the figure of merit being a measure of whether data can be written into a state element under steady state conditions and maintained under steady state conditions.

8. The method of claim 1, wherein the circuit design includes writable state elements and a variable is defined with respect to a fabricated component of a writable state element, the figure of merit being a measure of whether data can be written into a state element under time-varying conditions and maintained under time-varying conditions.

9. The method of claim 1, wherein the circuit design includes transistors and a variable is defined with respect to a fabricated transistor that is dependent on values of transistor parameters.

10. The method of claim 9, wherein the transistor parameters include at least one of: a threshold voltage, a channel length, or a channel width.

11. The method of claim 1, wherein the predetermined standard deviation of each variable is determined by statistical variations in a fabrication process.

12. A computer readable storage medium storing a program comprising instructions which, when executed, manipulate a processor to determine a likelihood of failure of a circuit to be made in accordance with a circuit design, the instructions comprising instructions to:
  simulate operation of a circuit to be made in accordance with the circuit design;
  determine a sensitivity of a figure of merit to each variable of a plurality of variables by the simulating of operation of the circuit to be made in accordance with the circuit design based on a departure of each of the variables from a respective mean value where the variables include at least one variable derived from measurements of a fabricated component or component combination included in the circuit design wherein the respective mean value is based on the measurements of a fabricated component or component combination included in the circuit design and the departure is based on a standard deviation of the at least one variable determined from the measurements of a fabricated component or component combination included in the circuit design;
  determine a plurality of normalized sensitivities of the figure of merit based on the sensitivity of the figure of merit to each variable;
  determine a simulation deviation for each variable based on the normalized sensitivities and based on a predetermined maximum tolerable failure probability for the circuit design;
  determine a value of the figure of merit based on the simulation deviations; and
  predict whether the circuit to be made in accordance with the circuit design will fail based on the determined value of the figure of merit and a failure criterion.

13. The computer-readable storage medium of claim 12, wherein the instructions further comprise instructions to determine the likelihood of failure of the circuit to be made in accordance with the circuit design, where the circuit design includes writable state elements and a variable is defined with respect to a fabricated component of a writable state element, the figure of merit being a measure of whether data can be written into a state element under steady state conditions and maintained under steady state conditions.

14. The computer-readable storage medium of claim 12, wherein the instructions further comprise instructions to determine the likelihood of failure of the circuit to be made in accordance with the circuit design, where the circuit design includes writable state elements and a variable is defined with respect to a fabricated component of a writable state element, the figure of merit being a measure of whether data can be written into a state element under time-varying conditions and maintained under time-varying conditions.

15. A method of determining a likelihood of failure of a circuit to be made in accordance with a circuit design, the method implemented in a processor, and comprising:
  determining a sensitivity of a figure of merit to each variable of a plurality of variables by simulating operation of the circuit using the processor, the determining of the sensitivity based on a departure of each of the variables from a respective mean value, wherein the variables include at least one variable derived from measurements of a fabricated component or component combination to be included in the circuit and wherein the respective mean value is based on the measurements of a fabricated component or component combination to be included in the circuit design and the departure is based on a standard deviation of the at least one variable determined from the measurements of a fabricated component or component combination to be included in the circuit design;
  determining a plurality of normalized sensitivities of the figure of merit based on the sensitivity of the figure of merit to each variable;
  determining a simulation deviation for each variable based on the normalized sensitivities and based on a predetermined maximum tolerable failure probability for the circuit design;
  determining a value of the figure of merit based on the simulation deviations; and
  predicting whether the circuit to be made in accordance with the circuit design will fail based on the determined value of the figure of merit and a failure criterion.

16. The method of claim 15, wherein determining a sensitivity of a figure of merit to each variable comprises:
  selecting a particular variable;
  fixing values of all variables except the particular variable;
  simulating operation of the circuit with the particular variable set to at least two different values;
  selecting a new particular variable; and
  repeating the fixing and simulating.

* * * * *